United States Patent
Zhang

(10) Patent No.: US 12,211,542 B2
(45) Date of Patent: Jan. 28, 2025

(54) CONTROL CIRCUIT ON MEMORY CHIP AND DYNAMIC RANDOM ACCESS MEMORY

(71) Applicant: CHANGXIN MEMORY TECHNOLOGIES, INC., Hefei (CN)

(72) Inventor: Jiarui Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 211 days.

(21) Appl. No.: 18/149,166

(22) Filed: Jan. 3, 2023

(65) Prior Publication Data

US 2024/0062802 A1 Feb. 22, 2024

(30) Foreign Application Priority Data

Aug. 22, 2022 (CN) .......................... 202211007805.X

(51) Int. Cl.
  *G11C 7/00* (2006.01)
  *G11C 5/06* (2006.01)
  *G11C 11/4072* (2006.01)
  *G11C 11/4074* (2006.01)

(52) U.S. Cl.
  CPC ............ *G11C 11/4074* (2013.01); *G11C 5/06* (2013.01); *G11C 11/4072* (2013.01)

(58) Field of Classification Search
  CPC ........................................................ G11C 7/10
  USPC .................................................. 365/189.18
  See application file for complete search history.

(56) References Cited

U.S. PATENT DOCUMENTS

2016/0086919 A1* 3/2016 Lee .................... H01L 25/0657
                                                            257/698

OTHER PUBLICATIONS

Jin Hee Cho et al., "A 1.2V 64Gb 341GB/s HBM2 Stacked DRAM with Spiral Point-to-Point TSV Structure and Improved Bank Group Data Control", 2018 IEEE International Solid-State Circuits Conference / Session 12 / DRAM / 12.3, total 3 pages.

\* cited by examiner

*Primary Examiner* — Hoai V Ho
(74) *Attorney, Agent, or Firm* — Kilpatrick Townsend & Stockton LLP

(57) ABSTRACT

Embodiments provide a control circuit and a dynamic random access memory. A first connector of the memory chip connects to an input terminal of a functional circuit via a first switch circuit, and an output terminal of the functional circuit connects to a second connector via a second switch circuit, where the first switch circuit and the second switch circuit correspond to a first switch state. A second connector is connected to an input terminal of a functional circuit via a third switch circuit, and an output terminal of the functional circuit is connected to the first connector via a fourth switch circuit, where the third switch circuit and the fourth switch circuit correspond to a second switch state. The switch circuit can control the first switch state or second switch state to be an on state on a basis of a location parity signal of the memory chip.

14 Claims, 6 Drawing Sheets

CONTROL CIRCUIT ON MEMORY CHIP AND DYNAMIC RANDOM ACCESS MEMORY

CROSS-REFERENCE TO RELATED APPLICATION

This application claims priority to Chinese Patent Application No. 202211007805.X, titled "CONTROL CIRCUIT ON MEMORY CHIP AND DYNAMIC RANDOM ACCESS MEMORY" and filed to the State Patent Intellectual Property Office on Aug. 22, 2022, the entire contents of which are incorporated herein by reference.

TECHNICAL FIELD

Embodiments of the present disclosure relate to the field of semiconductor technology, and more particularly, to a control circuit on memory chip and a dynamic random access memory.

BACKGROUND

In the technical field of semiconductors, memory chips (dies) may be stacked to reduce a height of a semiconductor product and save space. For example, every two memory chips may be stacked with circuit sides facing each other, which is referred to as face-to-face stacking. The semiconductor product may include one or more groups of memory chips stacked face to face.

In the prior art, in the above solution of face-to-face stacking, a functional circuit in each memory chip runs according to a stacking sequence. For example, in the memory chip at an odd location, a signal flow direction is from a first connector of the memory chip to a second connector of the memory chip by means of the functional circuit. In the memory chip at an even location, the signal flow direction is from the second connector of the memory chip to the first connector of the memory chip by means of the functional circuit.

However, the above solution leads to higher design costs, production costs, and production complexity of the memory chip.

SUMMARY

Embodiments of the present disclosure provide a control circuit on a memory chip and a dynamic random access memory.

In a first aspect, the embodiments of the present disclosure provide a control circuit, including: a switch circuit and a functional circuit, where the switch circuit includes a first switch circuit, a second switch circuit, a third switch circuit, and a fourth switch circuit. A first connector of the memory chip is connected to an input terminal of the functional circuit by means of the first switch circuit, and an output terminal of the functional circuit is connected to a second connector of the memory chip by means of the second switch circuit, where the first switch circuit and the second switch circuit correspond to a same first switch state. The second connector is connected to an input terminal of the same functional circuit by means of the third switch circuit, and an output terminal of the same functional circuit is connected to the first connector by means of the fourth switch circuit, where the third switch circuit and the fourth switch circuit correspond to a same second switch state, and the first switch state is opposite to the second switch state.

The switch circuit is configured to control the first switch state or the second switch state to be an on state on a basis of a location parity signal of the memory chip where the switch circuit is positioned, the location parity signal having a connection sequence uniquely corresponding to the first connector, the functional circuit, and the second connector.

In a second aspect, the embodiments of the present disclosure provide a dynamic random access memory, including a plurality of memory chips stacked face to face, where the plurality of memory chips are provided with the control circuit on the memory chip described in the first aspect.

BRIEF DESCRIPTION OF THE DRAWINGS

The accompanying drawings herein are incorporated in and constitute a part of this specification, illustrate embodiments conforming to the embodiments of the present disclosure and, together with the specification, serve to explain the principles of the embodiments of the present disclosure.

Some embodiments of the present disclosure have been shown by the above drawings, and more detailed description will be made hereinafter. These drawings and text description are not intended for limiting the scope of conceiving the embodiments of the present disclosure in any way, but for illustrating the concept of the embodiments of the present disclosure for those skilled in the art by referring to some embodiments.

DETAILED DESCRIPTION

Descriptions will now be made in detail to exemplary embodiments, examples of which are illustrated in the accompanying drawings. When accompanying drawings are mentioned in the following descriptions, the same numbers in different drawings represent the same or similar elements, unless otherwise represented. The implementations set forth in the following exemplary embodiments do not represent all implementations consistent with the embodiments of the present disclosure. Instead, they are merely examples of apparatuses and methods consistent with some aspects related to the embodiments of the present disclosure as recited in the appended claims.

Figure 1:
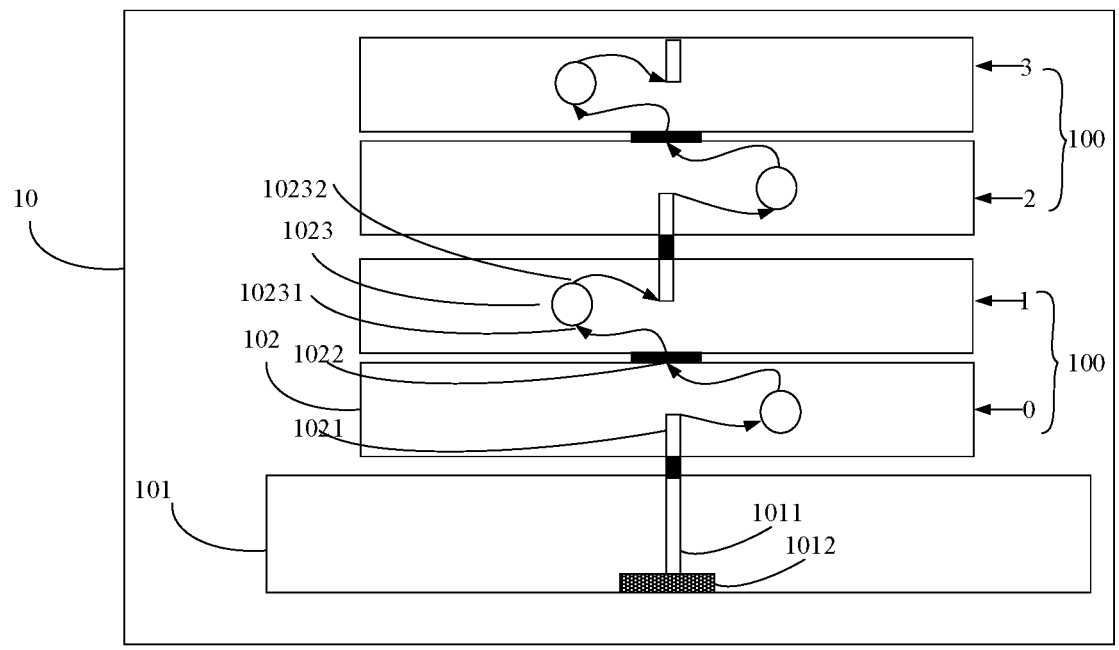
FIG. 1 is a schematic structural diagram of a dynamic random access memory stacked face to face according to an embodiment of the present disclosure.

The embodiments of the present disclosure are applicable to the memory chips in the dynamic random access memory stacked face to face, and are configured to control a signal transmission direction on the memory chips. FIG. 1 is a schematic structural diagram of a dynamic random access memory stacked face to face according to an embodiment of the present disclosure. Referring to FIG. 1, a logic chip 101 is at the bottommost part of a dynamic random access memory 10, and a plurality of memory chips 102 are stacked on the logic chip 101. The logic chip 101 is provided with a first connector 1011 configured to connect the memory chips 102. An input terminal 1012 of the logic chip 101 is configured to receive a signal and transmit the signal to the memory chips 102 stacked for processing.

The memory chips 102 stacked constitute one memory chip group 100 in units of two. For example, two memory chip groups 100 are shown in FIG. 1. In each memory chip group 100, two memory chips 102 are stacked face to face. That is, circuit sides of the two memory chips 102 in the same memory chip group 100 are opposite to each other, such that the two memory chips 102 in the same memory chip group 100 are connected by means of a second connector 1022. The adjacent memory chips 102 between different memory chip groups 100 are arranged back to back, such that the two memory chips 102 are connected by means of the first connector 1021.

The embodiments of the present disclosure are described by taking an example where the first connector 1011 is a through silicon via (TSV) and the second connector 1022 is hybridbond. However, it is to be understood that, in the embodiments of the present disclosure, the problem of signal flow direction of a functional circuit is caused by a face-to-face (F2F) configuration, and has nothing to do with types of the first connector 1011 and the second connector 1022. That is, the first connector 1011 and the second connector 1022 may be any type of connectors, and the first connector 1011 and the second connector 1022 may be the same type or different types of connectors. It should be noted that, when two memory chips are connected by means of the TSVs, in fact, the TSVs of each memory chip do not protrude from a substrate, and the adjacent TSVs are connected by means of a pad.

In the dynamic random access memory 10 shown in FIG. 1, a functional circuit 1023 may be provided on each memory chip 102 to achieve data processing, where the processing herein may be transmission, amplification, phase transformation, etc. Implementation of the functional circuit 1023 is not limited in the embodiments of the present disclosure.

When the functional circuits 1023 need to run in sequence between the memory chips 102 stacked, the functional circuits 1023 in different memory chips 102 have different connection relationships with the first connectors 1021 and the second connectors 1022 of the memory chips 102 where the functional circuits 1023 are positioned. For example, as shown in FIG. 1, the memory chips 102 stacked run the functional circuits 1023 therein one by one in sequence from bottom to top. In this case, for one memory chip group 100, the first connector 1021 of a lower memory chip 102 therein is connected to the input terminal 10231 of the functional circuit 1023 on the lower memory chip 102, and an output terminal 10232 of the functional circuit 1023 is connected to the second connector 1022 of the lower memory chip 102. The signal flow direction on the lower memory chip 102 is from the first connector 1021 to the second connector 1022 by means of the functional circuit 1023. The second connector 1022 of an upper memory chip 102 in the memory chip group 100 is connected to the input terminal 10231 of the functional circuit 1023 on the upper memory chip 102, and the output terminal 10232 of the functional circuit 1023 on the upper memory chip 102 is connected to the first connector 1021 of the upper memory chip 102. The signal flow direction on the upper memory chip 102 is from the second connector 1022 to the first connector 1021 by means of the functional circuit 1023.

As can be seen from the above description, among the memory chips 102 stacked, a circuit connection relationship between the memory chips 102 at odd locations is different from that between the memory chips 102 at even locations. In this scenario, two types of masks need to be designed for the memory chips, resulting in higher design costs and production costs of the masks, and higher production complexity of the masks.

Of course, the above problems not only exist in the memory chips in sequence of from bottom to top, but may also exist in the memory chips in sequence of from top to bottom.

Figure 2:
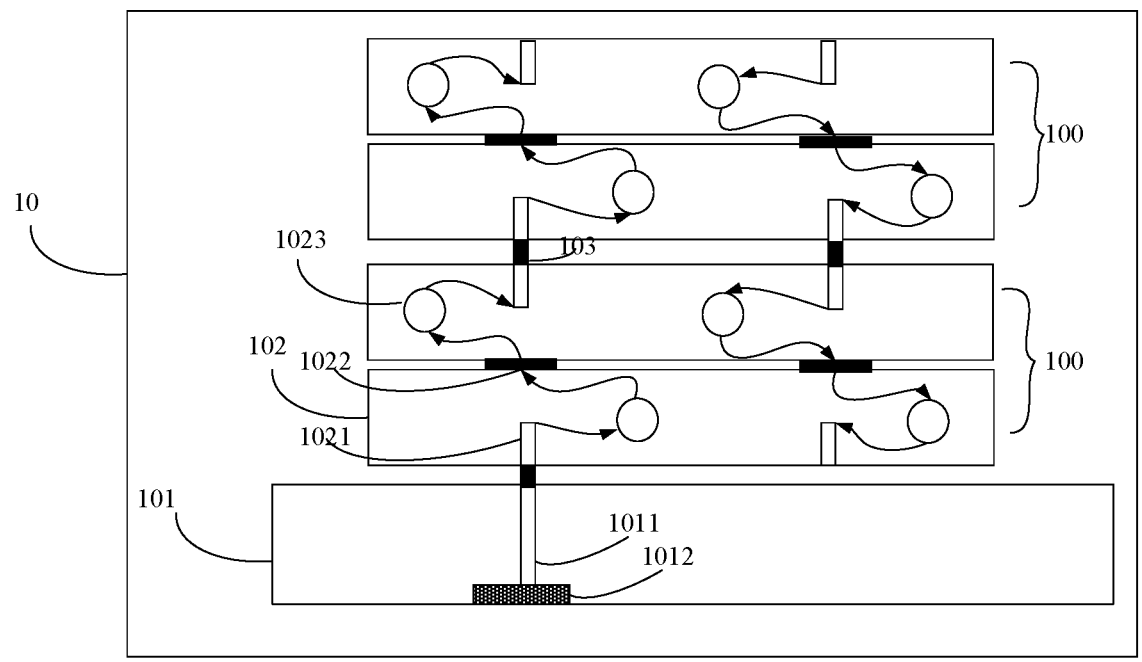
FIG. 2 is a schematic structural diagram of another dynamic random access memory stacked face to face according to an embodiment of the present disclosure.

In addition, two signal transmission directions may also be implemented on the same dynamic random access memory 10. FIG. 2 is a schematic structural diagram of another dynamic random access memory stacked face to face according to an embodiment of the present disclosure. Referring to FIG. 2, each memory chip 102 is provided with two sets of functional circuits 1023, two first connectors 1021, and two second connectors 1022. The connection relationship among the functional circuit 1023, the first connector 1021 and the second connector 1022 on the left side may be the same as that in FIG. 1, to implement the signal transmission sequence from bottom to top. The connection relationship among the functional circuit 1023, the first connector 1021 and the second connector 1022 on the right side is reversed, to implement the signal transmission sequence from top to bottom.

In conclusion, compared with the dynamic random access memory 10 shown in FIG. 1, the dynamic random access memory 10 shown in FIG. 2 may provide two signal transmission directions, and in practical applications, one of the signal transmission directions may be flexibly selected according to actual application scenarios. However, regardless of the structure in FIG. 1 or the structure in FIG. 2, two types of masks need to be designed for the memory chips, resulting in problems of higher design costs and production costs of the masks, and higher production complexity of the masks.

To solve the above problems, in the embodiments of the present disclosure, one control circuit is provided on the memory chip 102 to control the connection relationship between the functional circuit 1023 and the first connector 1021 and the connection relationship between the functional circuit 1023 and the second connector 1022, such that the circuit connection relationship between the memory chips 102 at the odd locations is opposite to that between the memory chips 102 at the even locations. The control circuit includes a switch circuit and the functional circuit 1023. The switch circuit includes a first switch circuit 201, a second switch circuit 202, a third switch circuit 203, and a fourth switch circuit 204. The first connector 1021 of the memory chip 102, the first switch circuit 201, the functional circuit 1023, the second switch circuit 202, and the second connector 1022 successively constitute one via; and the second connector 1022 of the memory chip 102, the third switch circuit 203, the functional circuit 1023, the fourth switch circuit 204, and the first connector 1021 successively constitute other via. In this way, two vias opposite in direction are formed. Therefore, the switch circuit on one via may be controlled to be turned on, such that this via is valid when the memory chip 102 is at the odd location, and the switch circuit on the other via may be controlled to be turned off, such that the other via is invalid when the memory chip 102 is at the odd location. The valid via on the memory chip 102 at the odd location is different from the valid via on the memory chip 102 at the even location.

As can be seen, the control circuit in the embodiments of the present disclosure may be set as the same control circuit for different memory chips 102, but different circuit connection relationships are implemented for different memory chips 102 through the switch circuit. In this way, only one set of masks for the memory chips 102 is needed, which can reduce the design and production costs and reduce the production complexity of the masks.

Figure 3:
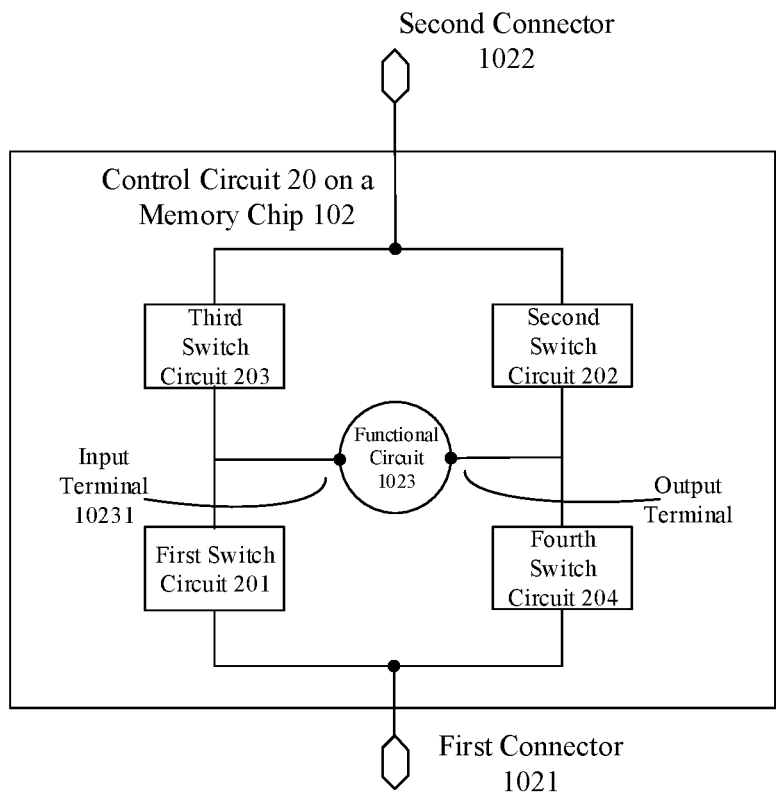
FIG. 3 is a schematic structural diagram of a control circuit on a memory chip according to an embodiment of the present disclosure.
Figure 4:
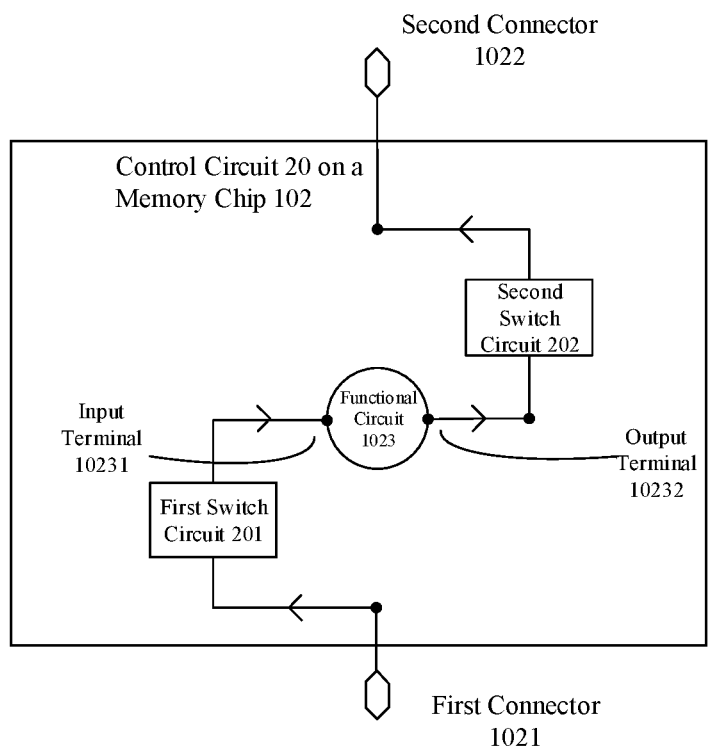
FIG. 4 and FIG. 5 are schematic diagrams of two signal transmission directions based on the control circuit in FIG. 3 according to an embodiment of the present disclosure.

FIG. 3 is a schematic structural diagram of a control circuit on a memory chip according to an embodiment of the present disclosure, and FIG. 4 is a schematic diagram of two signal transmission directions based on the control circuit in FIG. 3 according to an embodiment of the present disclosure.

Referring to FIG. 3, the control circuit 20 on the memory chip 102 includes the switch circuit and the functional circuit 1023, where the switch circuit includes first switch circuit 201, the second switch circuit 202, the third switch circuit 203, and the fourth switch circuit 204.

The first connector 1021 of the memory chip 102 is connected to the input terminal 10231 of the functional circuit 1023 via the first switch circuit 201, and the output terminal 10232 of the functional circuit 1023 is connected to the second connector 1022 of the memory chip 102 via the second switch circuit 202, where both the first switch circuit 201 and the second switch circuit 202 correspond to the same first switch state. That is, referring to FIG. 4, the first connector 1021, the first switch circuit 201, the functional circuit 1023, the second switch circuit 202 and the second connector 1022 successively constitute a first via, and the first via is valid when both the first switch circuit 201 and the second switch circuit 202 are in an on state, where the signal transmission direction is from the first connector 1021 to the second connector 1022.

The second connector 1022 is connected to the input terminal 10231 of the same functional circuit 1023 via the third switch circuit 203, and the output terminal 10232 of the same functional circuit 1023 is connected to the first connector 1021 via the fourth switch circuit 204. The third switch circuit 203 and the fourth switch circuit 204 correspond to the same second switch state, where the first switch state is opposite to the second switch state. That is, referring to FIG. 5, the second connector 1022, the third switch circuit 203, the functional circuit 1023, the fourth switch circuit 204 and the first connector 1021 successively constitute a second via, and the second via is valid when both the third switch circuit 203 and the fourth switch circuit 204 are in the on state, where the signal transmission direction is from the second connector 1022 to the first connector 1021.

The switch circuit is configured to control the first switch state or the second switch state to be the on state on the basis of a location parity signal of the memory chip 102 where the switch circuit is positioned, and the location parity signal has a connection sequence uniquely corresponding to the first connector 1021, the functional circuit 1023, and the second connector 1022.

The location parity signal is configured for indicating that the memory chips 102 are positioned at the odd locations or the even locations in the memory chips stacked. For example, taking an example where the memory chips 102 are numbered from 0 from bottom to top, for the four memory chips 102 stacked as shown in FIG. 1, the numbers are 0, 1, 2, and 3 from bottom to top. When the location parity signal is a low-level signal, it indicates that the memory chips 102 are positioned at the even locations. For example, the location parity signal corresponding to the memory chips 102 numbered 0 and 2 is the low-level signal. When the location parity signal is a high-level signal, it indicates that the memory chips 102 are positioned at the odd locations. For example, the location parity signal corresponding to the memory chips 102 numbered 1 and 3 is the high-level signal. Thus, the lower memory chips 102 in each memory chip group 100 are positioned at the even locations, and the upper memory chips 102 in each memory chip group 100 are positioned at the odd locations.

It should be noted that, a stack structure between the memory chips 102 in the random access dynamic memory 10 in the embodiments of the present disclosure is the same as that in FIG. 1, and the difference therebetween lies in that the circuit structure on each memory chip 102 in the embodiments of the present disclosure is different from that on the memory chip 102 in FIG. 1. The circuit structure on each chip in the embodiments of the present disclosure is the circuit structure of the control circuit 20 on the memory chip 102 shown in FIG. 3.

In one example, the signal is transmitted from bottom to top. The location parity signal of the memory chips 102 at the even locations is configured for controlling the first switch state to be an on state and controlling the second switch state to be an off state, such that the first via on the memory chips 102 at the even locations is turned on, and thus the signal is transmitted, on the memory chips 102 at the even locations, from the first connector 1021 to the second connector 1022 by means of the functional circuit 1023. Because the first connectors 1021 of the memory chips 102 at the even locations are positioned on a bottom, and the second connectors 1022 are positioned on a top, so the signal is transmitted from bottom to top.

Correspondingly, the location parity signal of the memory chips 102 at the odd locations is configured for controlling the second switch state to be the on state and controlling the first switch state to be the off state, such that the second via on the memory chips 102 at the even locations is turned on, and thus the signal is transmitted, on the memory chips 102 at the odd locations, from the second connector 1022 to the first connector 1021 by means of the functional circuit 1023. Because the first connectors 1021 of the memory chips 102 at the odd locations are positioned on the bottom, and the second connectors 1022 are positioned on the top, so the signal is transmitted from bottom to top.

Combining the memory chips 102 at the even locations and the memory chips 102 at the odd locations may implement upward transmission of the signal from the bottommost memory chip 102 to the topmost memory chip 102, which is consistent with the signal transmission direction shown in FIG. 1.

In one example, the signal is transmitted from top to bottom. The location parity signal of the memory chips 102 at the even locations is configured for controlling the second switch state to be the on state, and controlling the first switch state to be the off state, such that the second via on the memory chips 102 at the even locations is turned on, and thus the signal is transmitted, on the memory chips 102 at the even locations, from the second connector 1022 to the first connector 1021 by means of the functional circuit 1023. Because the first connectors 1021 of the memory chips 102 at the even locations are positioned on the bottom, and the second connectors 1022 are positioned on the top, the signal is transmitted from top to bottom.

Correspondingly, the location parity signal of the memory chips 102 at the odd locations is configured for controlling the first switch state to be the on state and controlling the second switch state to be the off state, such that the first via on the memory chips 102 at the odd locations is turned on, and thus the signal is transmitted, on the memory chips 102 at the odd locations, from the first connector 1021 to the second connector 1022 by means of the functional circuit 1023. Because the first connectors 1021 of the memory chips 102 at the odd locations are positioned on the top, and the second connectors 1022 are positioned on the bottom, so the signal is transmitted from top to bottom.

Combining the memory chips 102 at the even locations and the memory chips 102 at the odd locations may implement downward transmission of the signal from the topmost memory chip 102 to the bottommost memory chip 102, which is opposite to the signal transmission direction shown in FIG. 1.

It is to be understood that the relationship between the location parity signal and the location of the memory chip 102 may be set flexibly, which is not limited in the embodiments of the present disclosure.

To realize a fact that the first switch state corresponding to the first via is opposite to the second switch state of the second via, following two strategies may be used. In the first strategy, based on a fact that the first turn-on condition of the first via is different from the second turn-on condition of the second via, it is implemented that the first via or the second via is valid. In the second strategy, the first via is controlled to be valid or the second via is controlled to be valid based on different control signals when the turn-on conditions are the same.

In the first strategy, the first switch circuit 201 and the second switch circuit 202 correspond to the same first turn-on condition, the third switch circuit 203 and the fourth switch circuit 204 correspond to the same second turn-on condition, and the first turn-on condition is opposite to the second turn-on condition. That is, the same signal may only satisfy one of the turn-on conditions, but may not satisfy the first turn-on condition and the second turn-on condition simultaneously. Therefore, the same location parity signal may access the control terminals of the first switch circuit 201 to the fourth switch circuit 204, the location parity signal satisfies the first turn-on condition or the second turn-on condition, but does not satisfy the first turn-on condition and the second turn-on condition simultaneously.

To implement the above strategy, the first switch circuit 201 and the second switch circuit 202 may be the same circuit, and the third switch circuit 203 and the fourth switch circuit 204 may be another circuit. For example, both the first switch circuit 201 and the second switch circuit 202 are positive channel metal oxide semiconductor (PMOS) transistors, and both the third switch circuit 203 and the fourth switch circuit 204 are negative channel metal oxide semiconductor (NMOS) transistors. In this case, the location parity signal of the memory chips 102 at the even locations may be the low-level signal, to turn on the PMOS transistor to enable the first via, and to turn off the NMOS transistor to disable the second via. Correspondingly, the location parity signal of the memory chips 102 at the odd locations may be the high-level signal, to turn on the NMOS transistor to enable the second via, and to turn off the PMOS transistor to disable the first via. In this way, the transmission process of the signal from bottom to top is realized. If it is necessary to realize the transmission process from top to bottom, when the first switch circuit 201 to the fourth switch circuit 204 remain unchanged, the location parity signal of the memory chips 102 at the even locations may be set as the high-level signal, and the location parity signal of the memory chips 102 at the odd locations may be set as the low-level signal, such that the transmission direction is reversed.

Of course, both the first switch circuit 201 and the second switch circuit 202 may also be the PMOS transistors, and the third switch circuit 203 and the fourth switch circuit 204 may both be the NMOS transistors. In this case, the location parity signal may be adjusted accordingly.

In the second strategy, the first switch circuit 201 to the fourth switch circuit 204 all correspond to the same turn-on condition, and the same first control signal accesses the control terminal of the first switch circuit 201 and the control terminal of the second switch circuit 202. The same second control signal accesses the control terminal of the third switch circuit 203 and the control terminal of the fourth switch circuit 204, and the location parity signal is configured for indicating that the first control signal or the second control signal satisfies the turn-on condition.

To make the first switch circuit 201 to the fourth switch circuit 204 all correspond to the same turn-on condition, the first switch circuit 201 to the fourth switch circuit 204 may be the same circuit. For example, the first switch circuit 201 to the fourth switch circuit 204 are all the NMOS transistors, or the first switch circuit 201 to the fourth switch circuit 204 are all the PMOS transistors.

It should be noted that the above-mentioned first switch circuit 201 and the fourth switch circuit 204 may be any circuit devices including the above-mentioned MOS transistors having the on state and an off state, but are not limited to the above-mentioned MOS transistors.

In conclusion, the embodiments of the present disclosure provide two types of switch circuit structures. The first strategy may be applied to scenarios with unlimited switch types, while the second strategy may be applied to scenarios with limited switch types.

Figure 6:
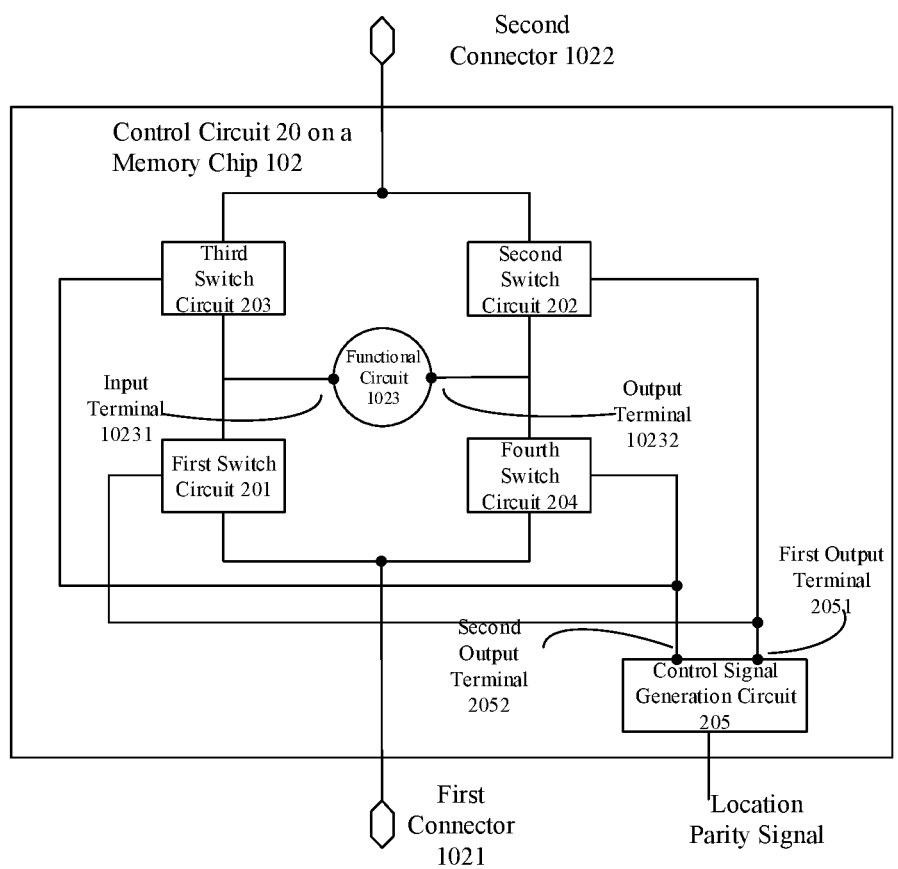
FIG. 6 is a schematic structural diagram of a control circuit on another memory chip according to an embodiment of the present disclosure.

In some embodiments, the control circuit in the above-mentioned second strategy may further include a control signal generation circuit. FIG. 6 is a schematic structural diagram of a control circuit on another memory chip according to an embodiment of the present disclosure. Referring to FIG. 6, the location parity signal accesses an input terminal of the control signal generation circuit 205, where the control signal generation circuit is configured to generate the first control signal and the second control signal according to the location parity signal, and output the first control signal and the second control signal respectively by means of a first output terminal 2051 and a second output terminal 2052. The control terminal of the first switch circuit 201 and the control terminal of the second switch circuit 202 are both connected to the first output terminal 2051; and the control terminal of the third switch circuit 203 and the control terminal of the fourth switch circuit 204 are both connected to the second output terminal 2052.

The control signal generation circuit 205 may include a first subcircuit and a second subcircuit, and input of the first subcircuit and input of the second subcircuit are both the location parity signal, where one of the first subcircuit and the second subcircuit is configured to input and output same transmission function, and other one of the first subcircuit and the second subcircuit is configured to input and output NOT gate logic. In this way, the first control signal and the second control signal may be controlled to be inverted.

For example, the first subcircuit may be a transmission circuit, the second subcircuit may be a NOT logic gate, the first control signal is the same as the location parity signal, and the second control signal is inverse to the location parity signal. In this case, the first switch circuit 201, the second switch circuit 202, the third switch circuit 203 and the fourth switch circuit 204 are all the PMOS transistors. Therefore, when the location parity signal is a low-level signal, the first via is turned on; and when the location parity signal is a high-level signal, the second via is turned on.

The first switch circuit 201 to the fourth switch circuit 204 may be bidirectional conduction circuits. That is, when the first switch circuit 201 to the fourth switch circuit 204 are turned on, the signal may be transmitted from a first end to a second end, or may be transmitted from the second end to the first end. In this case, the first end or the second end of the first switch circuit 201 may be connected to the first connector 1021, other end of the first switch circuit 201 may be connected to the input terminal 10231 of the functional circuit 1023; and the first end or the second end of the second switch circuit 202 may be connected to the second connector 1022, and other end of the second switch circuit 202 may be connected to the output terminal 10232 of the functional circuit 1023. Similarly, the third switch circuit 203 and the fourth switch circuit 204 are similar to the first switch circuit 201 and the second switch circuit 202, and thus are not unnecessarily elaborated herein.

When the first switch circuit 201 to the fourth switch circuit 204 are all unidirectional conduction circuits, the switch circuits need to be connected to the first connector 1021, the functional circuit 1023 and the second connector 1022 according to the conducting direction.

In some embodiments, as shown in FIG. 4, the conducting direction of the first switch circuit 201 and the conducting direction of the second switch circuit 202 are both consistent with the direction pointing from the first connector 1021 to the second connector 1022. That is, the input terminal of the first switch circuit 201 needs to be connected to the first connector 1021, and the output terminal of the first switch circuit 201 is connected to the input terminal 10231 of the functional circuit 1023; and the input terminal of the second switch circuit 202 is connected to the output terminal 10232 of the functional circuit 1023, and the output terminal of the second switch circuit 202 is connected to the second connector 1022. Only in this way, it may be ensured that the signal transmission direction of the first switch circuit 201, the signal transmission direction of the functional circuit 1023 and the signal transmission direction of the second switch circuit 202 on the first via are consistent, such that the continuity of the first via is ensured, and it is avoided that the first via cannot be turned on due to the different signal transmission directions of the devices on the first via.

Figure 5:
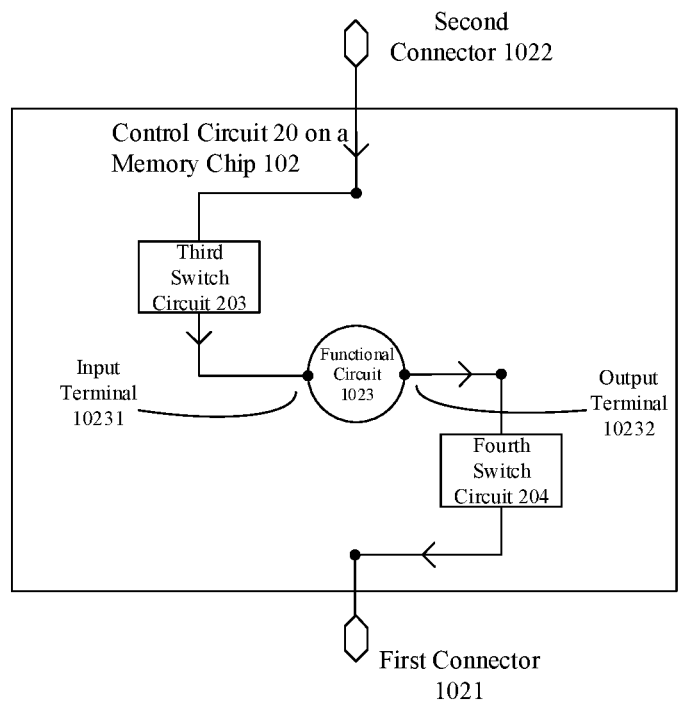

Referring to FIG. 5, the conducting direction of the third switch circuit 203 and the conducting direction of the fourth switch circuit 204 are both consistent with the direction pointing from the second connector 1022 to the first connector 1021. That is, the input terminal of the third switch circuit 203 needs to be connected to the second connector 1022, and the output terminal of the third switch circuit 203 is connected to the input terminal 10231 of the functional circuit 1023; and the input terminal of the fourth switch circuit 204 is connected to the output terminal 10232 of the functional circuit 1023, and the output terminal of the fourth switch circuit 204 is connected to the first connector 1021. Only in this way, it may be ensured that the signal transmission direction of the third switch circuit 203, the signal transmission direction of the functional circuit 1023 and the signal transmission direction of the fourth switch circuit 204 on the second via are consistent, such that the continuity of the second via is ensured, and it is avoided that the second via cannot be turned on due to the different signal transmission directions of the devices on the second via.

It should be noted that, the first switch circuit 201 to the fourth switch circuit 204 may be switch circuits only configured to transmit the signal. For example, when the first switch circuit 201 to the fourth switch circuit 204 are turned on, it is equivalent to one transmission line. Of course, on the basis of signal transmission, the first switch circuit 201 to the fourth switch circuit 204 may also perform amplification, level shift or the like on the data. For example, when the first switch circuit 201 to the fourth switch circuit 204 may include a driver, the driver may be configured to amplify the signal in the on state, to avoid signal loss caused by attenuation of the signal in the transmission process, which helps to improve success rate and accuracy of signal transmission.

When the first switch circuit 201 to the fourth switch circuit 204 are any circuits having the on or off state, the functional circuit 1023 in the embodiments of the present disclosure may also be any circuit that processes the data, such as a data increasing circuit, a power-on circuit, and a data transmission circuit.

The power-on circuit is configured to power on the memory chips 102 according to the sequence between the memory chips 102. For example, the memory chips 102 are powered on one by one according to the direction from bottom to top as shown in FIG. 1. Of course, the memory chips 102 may also be powered on one by one from top to bottom. Taking from bottom to top as an example, after the logic chip 101 is powered on, the signal is transmitted to the memory chip 102 in an upper layer, i.e., the memory chip 102 at the first even location. After the memory chip 102 at the first even location receives a signal by means of the first connector 1021, the signal is transmitted to the power-on circuit of the memory chip 102 in this layer, and the signal is transmitted to the memory chip 102 at the first odd location by means of the second connector 1022 of the memory chip 102 in this layer. After the memory chip 102 at the first odd location receives the signal, the signal is sent to the power-on circuit on the memory chip 102 in this layer, and the signal is transmitted to the first connector 1021 of the memory chip 102 in this layer. In this way, the upward execution is continued until the topmost memory chip 102 is powered on.

It is to be understood that, by sequentially powering on the memory chips 102 according to the sequence between the memory chips 102, it is beneficial to reduce a current peak while ensuring that the chips are powered on and turned on layer by layer. In addition, because other signals are also sequentially transmitted from top to bottom or from bottom to top, the chips are powered on layer by layer, and improper operation of the chips due to missing an instruction will not occur.

The data transmission circuit is configured to perform data transmission according to the sequence between the memory chips 102. It is the same as the above power-on process, except that the processing of the signal by the data transmission circuit is different from that of the power-on circuit. Herein, the data transmission circuit may directly transmit the signal after receiving the signal. The simplest data transmission circuit may be a transmission line or a drive circuit.

Figure 7:
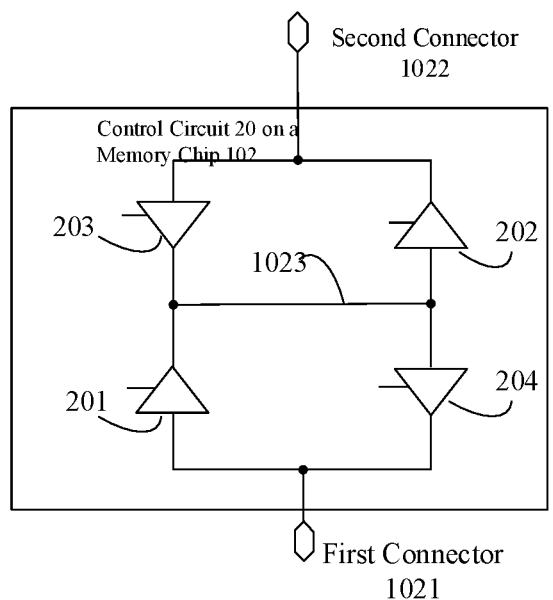
FIG. 7 is a schematic structural diagram of a control circuit on yet another memory chip according to an embodiment of the present disclosure.

FIG. 7 is a schematic structural diagram of a control circuit on yet another memory chip according to an embodiment of the present disclosure. The first switch circuit 201 to the fourth switch circuit 204 in the control circuit are all drive circuits, and the functional circuit 1023 is the data transmission circuit, such as a transmission line. In this way, the control circuit 10 on the memory chip 102 may be configured to implement driving process between the memory chips 102, and thus may also be called a redriver.

Figure 8:
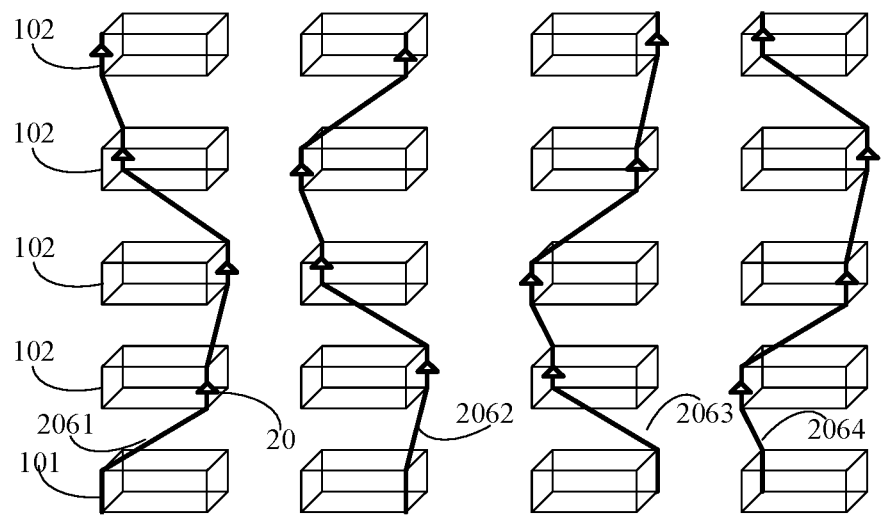
FIG. 8 is a schematic diagram of a spiral driving process according to an embodiment of the present disclosure.
Figure 9:
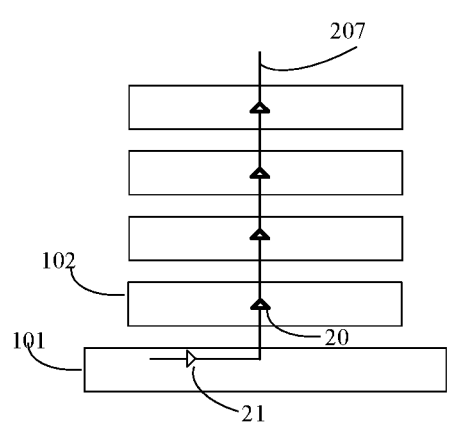
FIG. 9 is a schematic functional diagram of a structure as shown in FIG. 8.

The above driving process may be a spiral driving process or a linear driving process. FIG. 8 is a schematic diagram of a spiral driving process according to an embodiment of the present disclosure, and FIG. 9 is a schematic functional diagram of a structure as shown in FIG. 8.

Referring to FIG. 8, four memory chips 102 are stacked on the logic chip 101, and each memory chip 102 may be regarded as a cube. Four drive paths 2061 to 2064 are shown in FIG. 8. As can be seen from FIG. 8, the four drive paths 2061 to 2064 are all spiral, and the memory chips 102 may be redriven sequentially along each drive path. Each drive path includes control circuits 20 on a plurality of memory chips 102 shown in FIG. 7, namely drivers 20. That is, each memory chip 102 is provided with the control circuit 20 shown in FIG. 7.

In practical applications, four drive paths may be provided on the same dynamic random access memory 10 simultaneously, and one of the four drive paths may be selected.

As can be seen from FIG. 8, in the spiral drive paths, the circuit in FIG. 7 corresponds to transmission channels at different locations in different memory chips 102 to form the spiral drive paths. It should be noted that, the logic chip 101 in FIG. 9 is also provided with a driver 21. The driver may adopt the structure shown in FIG. 7 to adapt to the bottom-up or top-down transmission of the signal in different scenarios, or a conventional driver may be adopted.

The data increasing circuit is configured to increase the first data received to obtain the second data used by the memory chip 102. Similarly, it is the same as the above power-on process, except that the processing of the signal by the data increasing circuit is different from that of the power-on circuit. Herein, the data increasing circuit performs increase processing on the data after receiving the signal, and transmits the signal corresponding to the data increased to the memory chip 102 in the next layer. The increase processing herein may include, but is not limited to, data increasing or data decreasing, i.e., adding 1 to the data, or subtracting 1 from the data. Taking the addition of 1 to the data as an example, it may generally be applied to the scenario of numbering the memory chips stacked as shown in FIG. 1. The number of each memory chip 102 may be a preset number of digits, such as 4 digits. In this way, for any memory chip 102 in this layer, the numbering process is to receive the number of the previous memory chip 102, add 1 to the number to obtain the number of the memory chip 102 in this layer, and transmit the number of the memory chip 102 in this layer to the next memory chip 102.

It is to be understood that, when the data increasing circuit is used as the functional circuit, chip number SID counting from top to bottom may be implemented, and chip number SID counting from bottom to top may also be implemented. Counting from bottom to top (referring to FIG. 1) is consistent with IEEE1500 output sequence required by JEDEC, which is conducive to adapting to the existing mainstream application environment. When counting from top to bottom, the chip number SID of the memory chip in the top layer is set as 0. When a test is performed after chip stacking, if the number of chips stacked is unknown, it is easy to identify whether a chip is the chip in the top layer by means of the chip number SID, and then the chip in the top layer and the logic chip in the bottom layer are tested, without needing to fuse in the logic chip to record the number of chips stacked.

Furthermore, because different counting sequences of chip numbers have different practicability in different scenarios, and there is no conflict between applications in the different scenarios, the counting sequence of chips stacked may be adjusted according to actual application scenarios. For example, a top-down counting sequence is applied during testing to improve a test efficiency. When the test is completed and ready for factory use, a bottom-up counting sequence is adapted to mainstream products. When adjusting the counting sequence of the chips, parity location attributes of the chips need to be converted, such that the control circuit has the correct signal flow direction.

It should be noted that, although the present disclosure takes an example where the memory chips are stacked face to face (F2F), the circuits provided in the present disclosure may also be stacked face to back (a front surface of one memory chip faces a back surface of another memory chip, F2B). However, in the former stacking mode, the control signals of the control circuits in the adjacent memory chips are opposite, while in the latter stacking mode, the control signals of the control circuits in the adjacent memory chips are the same. That is, the control circuit provided by the present disclosure not only may be used for SID counting in the F2F scenario, but also may be used for SID scenario counting in the F2B scenario. Therefore, the control circuit has good compatibility.

The data increasing circuit is configured to increase or decrease the data. Because the first data before the increase and the second data after the increase are both preset digits, the first data and the second data differ by at least one bit. For example, when the first data is 0000, the second data may be 0001, that is, there is a difference of one bit of data. When the first data is 0111, the second data may be 1000, that is, there is a difference of four bits of data.

The data increasing circuit may include n increasing subcircuits, where n is a positive integer greater than or equal to 2. An $m^{th}$ increasing subcircuit is configured to generate data of an $m^{th}$ bit in the second data according to data of first to $m^{th}$ bits in the first data, where m is a positive integer greater than or equal to 1 and less than or equal to the n.

Each of the above-mentioned increasing subcircuits corresponds to one switch circuit, and a connection relationship between the increasing subcircuit and the switch circuit is consistent with a connection relationship between the aforementioned functional circuit 1023 and the switch circuit. In some embodiments, the first connector 1021 of the memory chip 102 is connected to an input terminal of the increasing subcircuit corresponding to the switch circuit by means of the first switch circuit 201 in the switch circuit, and an output terminal of the increasing subcircuit is connected to the second connector 1022 of the memory chip 102 by means of the second switch circuit 202 in the corresponding switch circuit.

The second connector 1022 is connected to the input terminal of the corresponding increasing subcircuit by means of the third switch circuit 203 in the switch circuit, and the output terminal of the increasing subcircuit is connected to the first connector 1021 by means of the fourth switch circuit 204 in the corresponding switch circuit. Different increasing subcircuits in the memory chips 102 correspond to the same location parity signal. Thus, in the same memory chip, all the increasing subcircuits have the first switch state, all the increasing subcircuits have the same second switching state, and all the increasing subcircuits have the same signal transmission direction.

In the embodiments of the present disclosure, each increasing subcircuit may be controlled. However, because the data increasing circuit is the functional circuit 1023 on one memory chip 102, different increasing subcircuits included in the same data increasing circuit are positioned on the same memory chip 102, and correspond to the same location parity signal. That is, different increasing subcircuits on the same memory chip 102 transmit the signal in the same direction, i.e., all from the first connectors 1021 to the second connectors 1022 by means of the increasing subcircuits, or all from the second connectors 1022 to the first connectors 1021 by means of the increasing subcircuits, such that correct increase of the data by the data increasing circuits may be ensured, and data increasing errors may be avoided.

It should be noted that, the data of the $m^{th}$ bit in the second data may be a result of logic processing for the data of the first to $m^{th}$ bits in the first data, and the logic processing is determined by the degree of increase or decrease. Taking an example where the second data is data obtained by adding 1 to the first data, for the 4-bit first data and the 4-bit second data, the first bit in the second data may be an inverted result of the first bit in the first data. The second bit in the second data may be an XOR result of the first and second bits in the first data. The third bit in the second data may be an XOR result of the third bit in the first data and the first AND result, where the first AND result is an AND result of the first and second bits in the first data. The fourth bit in the second data may be an XOR result of the fourth bit in the first data and the second AND result, where the second AND result is an AND result of the first to third bits in the first data.

Figure 10:
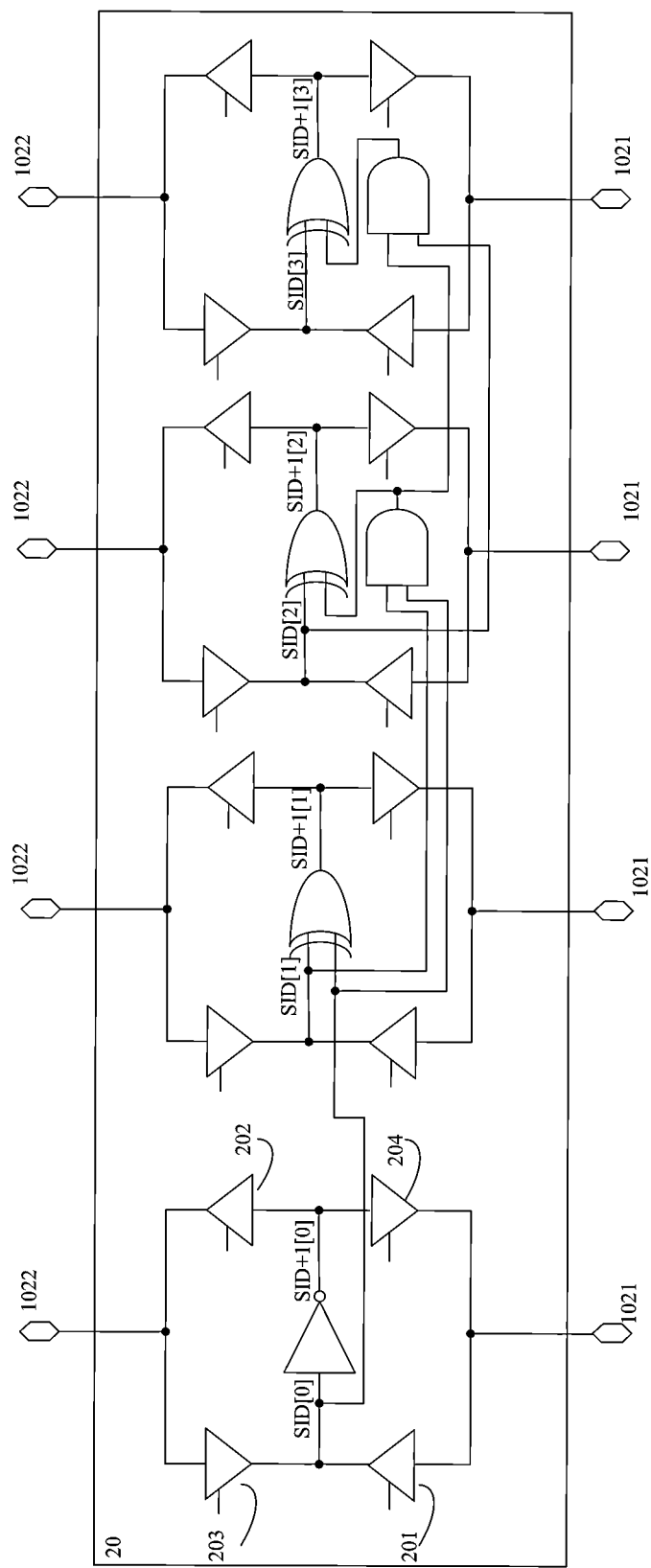
FIG. 10 is a schematic structural diagram of a control circuit on a memory chip when a functional circuit provided by an embodiment of the present disclosure is a data increasing circuit.

FIG. 10 is a schematic structural diagram of a control circuit on the memory chip 102 when the functional circuit provided by an embodiment of the present disclosure is the data increasing circuit. In the data increasing circuit shown in FIG. 10, n is 4, that is, there are four data increasing circuit shown in FIG. 10. Therefore, there are four switch circuits in FIG. 10, and the first switch circuit 201 to the fourth switch circuit 204 in the four switch circuits are all drive circuits.

Based on the above logic, as shown in FIG. 10, a first increasing subcircuit includes a NOT gate, where input of the NOT gate is data SID[0] of a first bit in the first data. The NOT gate is configured to generate data SID+1[0] of a first bit in the second data according to the data SID[0] of the first bit in the first data.

A second increasing subcircuit includes an XOR gate configured to generate data SID+1[1] of a second bit in the second data according to the data SID[0] of the first bit and data SID[1] of a second bit in the first data.

When the n is a positive integer greater than or equal to 3, the $m^{th}$ increasing subcircuit includes an AND gate and an XOR gate, where m is a positive integer greater than or equal to 3 and less than or equal to the n. The AND gate comprised in the $m^{th}$ increasing subcircuit is configured to determine an AND result for data of the first to $(m-1)^{th}$ bits in the first data; and the XOR gate of the $m^{th}$ increasing subcircuit is configured to generate the data of the $m^{th}$ bit in the second data according to the AND result and the data of the $m^{th}$ bit in the first data. For example, the AND gate in a third increasing subcircuit in FIG. 10 is configured to determine a first AND result for data SID[0] of the first bit and data SID[1] of a second bit in the first data; and the XOR gate of the third increasing subcircuit is configured to generate data SID+1[2] of a third bit in the second data according to the first AND result and the data SID[2] of the third bit in the first data. For example, the AND gate in a fourth increasing subcircuit in FIG. 10 is configured to determine a second AND result for the data SID[0] of the first bit to the data SID[2] of the third bit in the first data; and the XOR gate of the fourth increasing subcircuit is configured to generate data SID+1[3] of a fourth bit in the second data according to the second AND result and data SID[3] of the fourth bit in the first data.

The four switch circuits in FIG. 10 may be connected to the same first connector 1021 and the same second connector 1022, or may be connected to one first connector 1021 and one second connector 1022 respectively.

It is to be understood that, when n is 2, there are only the first increasing subcircuit and the second increasing subcircuit. When n is 3, there are only the first increasing subcircuit to the third increasing subcircuit. When n is greater than 4, (n−4) increasing subcircuits that are the same as the fourth increasing subcircuit may be connected after the fourth increasing subcircuit shown in FIG. 10.

It should be noted that, the internal structure of each increasing subcircuit may be adjusted flexibly, as long as the input and the output satisfy the above input-output relationship. For example, the second increasing subcircuit may also be a circuit including an XNOR gate and a NOT gate. The input of the XNOR gate is the same as the input of the XOR gate of the second increasing subcircuit in FIG. 2, the output terminal of the XNOR gate is connected to the input terminal of the NOT gate, and the output of the NOT gate is used as the output of the second increasing subcircuit. In this way, it is equivalent to deforming the second increasing subcircuit, but the input and the output remain unchanged. Similarly, rest of the increasing subcircuits may be deformed, which is not to be described in detail here.

The embodiments of the present disclosure also provide a dynamic random access memory, including a plurality of memory chips 102 stacked face to face, and each memory chip 102 is provided with the control circuit on the aforementioned memory chip 102. The stacking mode of the plurality of memory chips 102 may be the same as that shown in FIG. 1. However, the difference lies in that the circuits provided on the memory chips 102 also include, in addition to the functional circuit 1023 in FIG. 1, the first switch circuit 201 to the fourth switch circuit 204 connected to the functional circuit 1023.

In addition to being connected to the second switch circuit 202 and the fourth switch circuit 204, the output terminal 10232 of the functional circuit 1023 may also be connected to a data use circuit of the memory chip 102, to supply the data outputted by the functional circuit 1023 to the memory chip 102 in this layer for use. For example, the functional circuit 1023 is a data increasing circuit, and the second data outputted is the number of the memory chip 102 in this layer.

In some embodiments, the memory chip 102 is provided with at least two transmission channels, and the transmission channel of the memory chip 102 is connected to the transmission channel of the adjacent memory chip 102 in a staggered manner. Each of the plurality of memory chips 102 is configured to obtain different location information with the adjacent memory chip 102 on the basis of the transmission channels at the same location, and the transmission channels on the plurality of memory chips 102 have the same staggered direction. The location information obtained by one of the transmission channels on the memory chips 102 is used as the location parity signal of the memory chips 102, and the location information indicates that locations of the memory chips 102 in the dynamic random access memory are odd locations or even locations.

Figure 11:
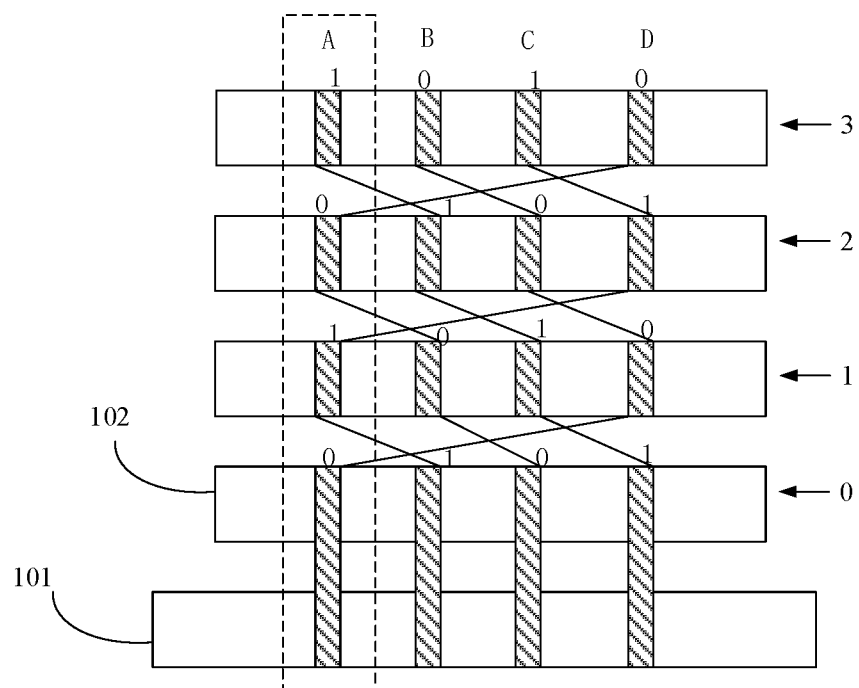
FIG. 11 is a schematic diagram showing a staggered connection of transmission channels between different memory chips according to an embodiment of the present disclosure.

The locations of the transmission channels on the memory chips 102 are fixed. For example, referring to FIG. 11, four transmission channels are provided at four locations A, B, C and D of each memory chip 102. After the memory chips 102 are stacked, the transmission channels at the same locations on different memory chips 102 are aligned in a direction perpendicular to the surfaces of the memory chips 102. For example, in FIG. 11, the transmission channels at the locations A of different memory chips 102 are aligned in the vertical direction, and the same is true for the locations B, the locations C and the locations D, which will not be repeated herein.

The staggered connection means that the transmission channel at a certain location of each memory chip 102 is connected to the transmission channel at another location in the horizontal direction. For example, referring to FIG. 11, the transmission channel at the location A of any memory chip 102 is connected to the transmission channel at the location B of the memory chip 102 in the next layer, the transmission channel at the location B of the memory chip 102 in this layer is connected to the transmission channel at the location C of the memory chip 102 in the next layer, the transmission channel at the location C of the memory chip 102 in this layer is connected to the transmission channel at the location D of the memory chip 102 in the next layer, and the transmission channel at the location D of the memory chip 102 in this layer is connected to the transmission channel at the location A of the memory chip 102 in the next layer.

The location parity signal may be location information obtained by the transmission channel at any location, but the location parity signals of the different memory chips 102 correspond to the transmission channel at the same location. In some embodiments, the control circuit may further include: a data read circuit connected to any one of the transmission channels and configured to read the location information outputted by the any one of the transmission channels as the location parity signal of the memory chip 102. The locations of the transmission channels read by the data read circuits of the different memory chips 102 are the same on the corresponding memory chips 102. For example, all of them are one of A, B, C, or D.

In some embodiments, there are even number of transmission channels on each of the plurality of memory chips 102, adjacent transmission channels on a bottommost memory chip 102 connected to the logic chip 101 correspond to different location information, and the transmission channels spaced on the bottommost memory chip 102 correspond to the same location information. For example, referring to FIG. 11, the location information corresponding to the transmission channels at the locations A to D is 0, 1, 0, and 1, respectively. In this way, the numbering starts from the bottommost memory chip 102, and the numbers are 0, 1, 2, and 3, respectively. The location information of the transmission channels at the locations A to D of the memory chips 102 at the even locations 0 and 2 are 0, 1, 0, and 1, respectively; and the location information of the transmission channels at the locations A to D of the memory chips 102 at the odd locations 1 and 3 are 1, 0, 1, and 0, respectively. If the location information of the transmission channel at the location A is used as the location parity signal, the location parity signal of the memory chip 102 at the even location is 0, and the location parity signal of the memory chip 102 at the odd location is 1.

Of course, the location information corresponding to the transmission channels at the locations A to D of the lowermost memory chip may also be 1, 0, 1, and 0, and accordingly, the staggered connection relationship may be adjusted adaptively. The location information of the location B may also be used as the location parity signal, as long as the parity location signal of the memory chip 102 at the odd location is different from the parity location signal of the memory chip 102 at the even location.

It is also to be noted that terms such as "comprise", "include" or any other variants thereof herein are intended to cover a non-exclusive "comprise" such that a process, a method, a merchandise or an apparatus comprising a series of elements not only includes these elements, but also includes other elements not listed explicitly, or also includes inherent elements of the process, the method, the merchandise or the apparatus. In the case of no more restrictions, elements restricted by a sentence "include one . . . " do not exclude the fact that additional identical elements may exist in a process, a method, a merchandise or an apparatus of these elements.

The serial numbers of the above embodiments of the present disclosure are merely illustrated for description, and do not represent superiorities or inferiorities of the embodiments.

The embodiments mentioned above are merely some embodiments of the present disclosure and are not intended to limit the scope of patent of the embodiments of the present disclosure. Any equivalent structure or equivalent process transformation made by using the specification and drawings of the embodiments of the present disclosure or directly or indirectly applied to other related technical fields shall be similarly covered in the scope of patent protection of the embodiments of the present disclosure.

What is claimed is:

1. A control circuit on a memory chip, comprising: a switch circuit and a functional circuit, the switch circuit comprising a first switch circuit, a second switch circuit, a third switch circuit, and a fourth switch circuit;
   wherein a first connector of the memory chip is connected to an input terminal of the functional circuit by means of the first switch circuit, and an output terminal of the functional circuit is connected to a second connector of the memory chip by means of the second switch circuit, and the first switch circuit and the second switch circuit correspond to a same first switch state;
   the second connector is connected to an input terminal of the same functional circuit by means of the third switch circuit, and an output terminal of the same functional circuit is connected to the first connector by means of the fourth switch circuit, the third switch circuit and the fourth switch circuit corresponding to a same second switch state, and the first switch state being opposite to the second switch state; and
   the switch circuit is configured to control the first switch state or the second switch state to be an on state on a basis of a location parity signal of the memory chip where the switch circuit is positioned, the location parity signal having a connection sequence uniquely corresponding to the first connector, the functional circuit, and the second connector.

2. The control circuit on the memory chip according to claim 1, wherein the first switch circuit and the second switch circuit correspond to a same first turn-on condition, and the third switch circuit and the fourth switch circuit correspond to a same second turn-on condition, the first turn-on condition being opposite to the second turn-on condition; and the location parity signal accesses control terminals of the first switch circuit to the fourth switch circuit, the location parity signal satisfying the first turn-on condition or the second turn-on condition.

3. The control circuit on the memory chip according to claim 1, wherein the first switch circuit to the fourth switch circuit all correspond to a same turn-on condition, a same first control signal accesses a control terminal of the first switch circuit and a control terminal of the second switch circuit, and a same second control signal accesses a control terminal of the third switch circuit and a control terminal of the fourth switch circuit, and the location parity signal being configured for indicating that the first control signal or the second control signal satisfies the turn-on condition.

4. The control circuit on the memory chip according to claim 3, wherein the control circuit further comprises a control signal generation circuit, the location parity signal accesses an input terminal of the control signal generation circuit, the control signal generation circuit being configured to generate the first control signal and the second control signal according to the location parity signal, and output the first control signal and the second control signal respectively by means of a first output terminal and a second output terminal;

wherein the control terminal of the first switch circuit and the control terminal of the second switch circuit are both connected to the first output terminal; and wherein the control terminal of the third switch circuit and the control terminal of the fourth switch circuit are both connected to the second output terminal.

5. The control circuit on the memory chip according to claim 1, wherein the first switch circuit to the fourth switch circuit are all unidirectional conduction circuits, both a conducting direction of the first switch circuit and a conducting direction of the second switch circuit being consistent with a direction pointing from the first connector to the second connector, and both a conducting direction of the third switch circuit and a conducting direction of the fourth switch circuit being consistent with a direction pointing from the second connector to the first connector.

6. The control circuit on the memory chip according to claim 5, wherein each of the first switch circuit to the fourth switch circuit comprises a drive circuit.

7. The control circuit on the memory chip according to claim 1, wherein the functional circuit comprises at least one of: a data increasing circuit, a power-on circuit, and a data transmission circuit, the data increasing circuit being configured to increase first data received by the memory chip to obtain second data used by the memory chip, the power-on circuit being configured to power on the memory chip according to a sequence between the memory chips, and the data transmission circuit being configured to perform data transmission according to the sequence between the memory chips.

8. The control circuit on the memory chip according to claim 7, wherein the data increasing circuit comprises n increasing subcircuits, an $m^{th}$ increasing subcircuit being configured to generate data of an $m^{th}$ bit in the second data according to data of first to $m^{th}$ bits in the first data, n being a positive integer greater than or equal to 2, and m being a positive integer greater than or equal to 1 and less than or equal to the n;

each of the increasing subcircuits corresponds to one of the switch circuits, the first connector of the memory chip being connected to an input terminal of the increasing subcircuit corresponding to the switch circuit by means of the first switch circuit in the switch circuit, and an output terminal of the increasing subcircuit being connected to the second connector of the memory chip by means of the second switch circuit in the corresponding switch circuit; and the second connector is connected to the input terminal of the corresponding increasing subcircuit by means of the third switch circuit in the switch circuit, and the output terminal of the increasing subcircuit is connected to the first connector by means of the fourth switch circuit in the corresponding switch circuit, the different increasing subcircuits in the memory chip corresponding to the same location parity signal.

9. The control circuit on the memory chip according to claim 8, wherein a first one of the increasing subcircuits comprises a NOT gate, input of the NOT gate being data of a first bit in the first data, and the NOT gate being configured to generate data of a first bit in the second data according to the data of the first bit in the first data;

a second one of the increasing subcircuits comprises an XOR gate configured to generate data of a second bit in the second data according to the data of the first bit and data of a second bit in the first data; and when the n is a positive integer greater than or equal to 3, the $m^{th}$ increasing subcircuit comprises an AND gate and an XOR gate, m being a positive integer greater than or equal to 3 and less than or equal to the n; the AND gate comprised in the $m^{th}$ increasing subcircuit is configured to determine an AND result for data of the first to $(m-1)^{th}$ bits in the first data; and the XOR gate of the $m^{th}$ increasing subcircuit is configured to generate the data of the $m^{th}$ bit in the second data according to the AND result and the data of the $m^{th}$ bit in the first data.

10. The control circuit on the memory chip according to claim 1, wherein the first connector comprises through silicon vias, and the second connector comprises hybrid-bond.

11. A dynamic random access memory, comprising a plurality of memory chips stacked face to face, wherein the plurality of memory chips are provided with the control circuit on the memory chip according to claim 1.

12. The dynamic random access memory according to claim 11, wherein each of the plurality of memory chips is provided with at least two transmission channels, the transmission channels on each of the plurality of memory chips are connected to the transmission channels on adjacent one of the plurality of memory chips in a staggered manner, each of the plurality of memory chips is configured to obtain different location information with the adjacent one of the plurality of memory chips on the basis of the transmission channels at a same location, and the transmission channels on the plurality of memory chips have same staggered direction, the location information obtained by one of the transmission channels on the plurality of memory chips being used as a location parity signal of the plurality of memory chips, and the location information indicating that locations of the plurality of memory chips in the dynamic random access memory are odd locations or even locations.

13. The dynamic random access memory according to claim 12, wherein there are even number of transmission channels on each of the plurality of memory chips, adjacent two of the transmission channels on a bottommost one of the plurality of memory chips connected to logic chips correspond to different location information, and the transmission channels spaced on the bottommost memory chip correspond to the same location information.

14. The dynamic random access memory according to claim 12, further comprising: data read circuits configured to read the location information outputted by any one of the transmission channels, wherein the transmission channels read by the data read circuits of different ones of the plurality of memory chips have the same location on corresponding ones of the plurality of memory chips.

\* \* \* \* \*